United States Patent
Takahashi et al.

(10) Patent No.: US 10,646,836 B2
(45) Date of Patent: May 12, 2020

(54) CLEANING APPARATUS

(71) Applicant: SHIGENKAIHATSUKENKYUJYO, INC., Tokyo (JP)

(72) Inventors: Tsunejiro Takahashi, Yokohama (JP); Hideki Yamaguchi, Yokohama (JP); Shogoro Kudaka, Yokohama (JP)

(73) Assignee: SHIGENKAIHATSUKENKYUJYO, INC., Tokyo (JP)

( * ) Notice: Subject to any disclaimer, the term of this patent is extended or adjusted under 35 U.S.C. 154(b) by 0 days.

(21) Appl. No.: 15/329,276

(22) PCT Filed: Jul. 29, 2015

(86) PCT No.: PCT/JP2015/071519
§ 371 (c)(1),
(2) Date: Jan. 26, 2017

(87) PCT Pub. No.: WO2016/017700
PCT Pub. Date: Feb. 4, 2016

(65) Prior Publication Data
US 2018/0085720 A1 Mar. 29, 2018

(30) Foreign Application Priority Data
Jul. 31, 2014 (JP) .................................. 2014-155963

(51) Int. Cl.
*B01F 5/00* (2006.01)
*B01F 5/12* (2006.01)
(Continued)

(52) U.S. Cl.
CPC .............. *B01F 5/12* (2013.01); *B01F 3/0446* (2013.01); *B01F 3/04049* (2013.01);
(Continued)

(58) Field of Classification Search
CPC ...... B01F 5/12; B01F 3/04049; B01F 3/0446; B01F 5/0057; B01F 5/0206;
(Continued)

(56) References Cited

U.S. PATENT DOCUMENTS 6,082,381 A * 7/2000 Kamikawa ................ B08B 3/10
134/102.2
6,880,724 B1 * 4/2005 Liu ........................ G03F 7/162
222/1

(Continued)

FOREIGN PATENT DOCUMENTS

JP 2000-317811 A 11/2000
JP 2010-029770 A 2/2010
(Continued)

OTHER PUBLICATIONS

Espacenet Translaiton of JP2013166143. From Aug. 29, 2013. Retrieved Sep. 7, 2018. pp. 1-29. (Year: 2013).*
(Continued)

*Primary Examiner* — Anshu Bhatia
(74) *Attorney, Agent, or Firm* — Sughrue Mion, PLLC (57) ABSTRACT

The problem to be addressed by the present invention is to provide a cleaning apparatus capable of obtaining a cleaning liquid having a high degree of cleanliness. A cleaning apparatus 10 includes a dissolution tank 20 for dissolving a gas in a liquid, a transfer pump 30 for sending the liquid together with the gas into the dissolution tank 20, and a feed nozzle 40 for feeding the liquid stored in the dissolution tank 20 to a workpiece W. The transfer pump 30 is a positive displacement pump. Portions of the dissolution tank 20, the transfer pump 30, and the feed nozzle 40 that come into contact with the liquid are made of a fluororesin.

10 Claims, 9 Drawing Sheets

(51) Int. Cl.
  *H01L 21/304* (2006.01)
  *B01F 5/02* (2006.01)
  *B01F 3/04* (2006.01)
  *B08B 3/10* (2006.01)
  *H01L 21/02* (2006.01)
  *B01F 13/10* (2006.01)

(52) U.S. Cl.
  CPC .......... *B01F 5/0057* (2013.01); *B01F 5/0206* (2013.01); *B08B 3/10* (2013.01); *H01L 21/02041* (2013.01); *H01L 21/304* (2013.01); B01F 2003/04886 (2013.01); B01F 2013/1052 (2013.01)

(58) Field of Classification Search
  CPC ... B01F 2003/04886; B01F 2013/1052; B08B 3/10; H01L 21/02041; H01L 21/304
  See application file for complete search history.

(56) References Cited

U.S. PATENT DOCUMENTS

| | | | | |
|---|---|---|---|---|
| 6,921,063 | B2* | 7/2005 | Ozawa | B01D 53/22 261/23.1 |
| 7,059,759 | B2* | 6/2006 | Hummer | B01F 5/0218 366/137 |
| 7,108,250 | B2* | 9/2006 | Lee | B01F 3/04049 261/28 |
| 7,481,867 | B2* | 1/2009 | Harpham | G03F 7/70341 95/175 |
| 7,677,202 | B2* | 3/2010 | Takahashi | A01K 13/001 119/665 |
| 7,905,653 | B2* | 3/2011 | Wilmer | B01F 3/0861 366/132 |
| 8,336,734 | B2* | 12/2012 | Ware | B67D 7/0261 137/210 |
| 2007/0108640 | A1* | 5/2007 | Takahashi | A45D 19/14 261/76 |
| 2009/0273103 | A1* | 11/2009 | Watanabe | B01F 3/0446 261/5 |
| 2010/0077650 | A1* | 4/2010 | Shiode | C10G 31/06 44/300 |
| 2011/0079247 | A1* | 4/2011 | Ma | H01L 21/67051 134/18 |
| 2011/0128814 | A1* | 6/2011 | Hanada | B01F 5/0614 366/339 |
| 2013/0079269 | A1 | 3/2013 | Koike et al. | |

FOREIGN PATENT DOCUMENTS

| | | |
|---|---|---|
| JP | 2010-177535 A | 8/2010 |
| JP | 2012-000578 A | 1/2012 |
| JP | 2012-236151 A | 12/2012 |
| JP | 2013-166143 A | 8/2013 |
| JP | 2014069134 A | 4/2014 |

OTHER PUBLICATIONS

International Search Report of PCT/JP2015/071519 dated Sep. 29, 2015 [PCT/ISA/210].

Notification of Reasons for Refusal dated Feb. 12, 2019 from the Japanese Patent Office in application No. 2016-538404.

* cited by examiner

CLEANING APPARATUS

CROSS REFERENCE TO RELATED APPLICATIONS

This application is a National Stage of International Application No. PCT/JP2015/071519, filed Jul. 29, 2015, claiming priority based on Japanese Patent Application No. 2014-155963, filed Jul. 31, 2014, the contents of all of which are incorporated herein by reference in their entirety.

TECHNICAL FIELD

The present invention relates to a cleaning apparatus to be used, for example, in a cleaning process of a semiconductor.

BACKGROUND ART

In a semiconductor manufacturing process, cleaning for removing particles, organic substances or the like adhered to a silicon wafer or a thin film is performed.

Typical examples of the semiconductor cleaning technique is RCA cleaning method. The RCA cleaning method is a wet cleaning method for Si substrates that are based on cleaning with ammonium and hydrogen peroxide solution (SC1), and cleaning with hydrochloric acid and hydrogen peroxide solution (SC2).

A semiconductor cleaning method is also known which utilizes the decomposition ability of OH radicals contained in ozone water to decompose an organic substance. For example, Patent Document 1 discloses a semiconductor wafer cleaning system including a cleaning apparatus for cleaning a semiconductor wafer with ozone water, and an ozone water producing apparatus for supplying ozone water into the cleaning apparatus.

PRIOR ART LITERATURE

Patent Literature

Patent Document 1: JP 2010-177535A

SUMMARY OF THE INVENTION

Problem to be Solved by the Invention

It is said to be difficult to maintain the concentration of ozone dissolved in water at a high level over a long period of time. This is because the ozone dissolved in water quickly decomposed to be oxygen. Another reason is that ozone dissolved in water is immediately released into the atmosphere.

The present inventors have discovered that generation of microbubbles in water containing dissolved ozone can make it possible to maintain the concentration of ozone in ozone water at a high level over a long period of time, and have filed applications for inventions relating to apparatuses for producing ozone water (see, for example, JP 2012-101222A).

The present inventors have confirmed that a very excellent cleaning effect is obtained when water in which ozone is dissolved and microbubbles are generated (hereinafter, such water may be referred to as "microbubbles ozone water") is used for cleaning semiconductors.

However, application of the conventional ozone water production apparatus to a semiconductor cleaning step raises the following problems.

The conventional ozone water production apparatus uses metals for those portions of a pipe, a tank, a valve and a pump or the like which come into contact with a liquid, and sometimes metal ions are eluted into water. In addition, metal debris generated at a sliding portion, or a foreign matter or the like produced by corrosion of a metal is sometimes mixed into water. Therefore, it is difficult to apply ozone water produced using the conventional ozone water production apparatus to the semiconductor cleaning step that requires an extremely high cleanliness.

Further, the conventional ozone water production apparatus sucks ozone together with water by means of a centrifugal pump (e.g., volute pump), and mixes the water with the ozone by the agitation force of an impeller. However, the use of a metal material for the shaft portion of the impeller of the centrifugal pump makes it difficult to avoid the problem of contaminating cleaning water with the elution of metal ions and the mixing of a foreign matter or the like.

The present invention has been made in view of the above problems, and an object of the invention is to provide a cleaning apparatus capable of obtaining a cleaning liquid having a high degree of cleanliness.

Means for Solving the Problems

The problems are solved by the following invention.

A cleaning apparatus including:
a dissolution tank for dissolving a gas in a liquid;
a transfer pump for sending the liquid together with the gas into the dissolution tank; and
a feed nozzle for feeding the liquid stored in the dissolution tank to a workpiece,
wherein
the transfer pump is a positive displacement pump, and
portions of the dissolution tank, the transfer pump, and the feed nozzle that come into contact with the liquid are made of a fluororesin.

The feed nozzle is preferably a microbubble generating nozzle.

The gas is preferably ozone.

The liquid is preferably water.

It is preferable that the transfer pump is a diaphragm pump, and
a diaphragm of the diaphragm pump is made of a fluororesin.

It is preferable that an injection pipe is provided inside the dissolution tank, and
an injection hole for injecting the liquid sent by the positive displacement pump toward an inner wall of the dissolution tank is provided in an outer periphery of the injection pipe.

It is preferable that two injection holes are provided in the outer periphery of the injection pipe, and
the two injection holes are provided in positions separated by approximately 90 degrees from each other in the outer periphery of the injection pipe.

It is preferable that a gas release valve for releasing the gas accumulated inside the dissolution tank to outside is provided at an upper portion of the dissolution tank.

It is preferable that the cleaning apparatus includes:
a level gauge for measuring a height of a level of the liquid stored in the dissolution tank; and
control means for controlling the gas release valve so that the height of the liquid level measured by the level gauge becomes constant.

It is preferable that the control means controls the gas release valve so that the height of the liquid level measured by the level gauge becomes 1 mm or more and 20 mm or less from an upper base of the dissolution tank.

It is preferable that the workpiece is s a semiconductor wafer, a liquid crystal substrate, or a solar cell substrate.

Effect of the Invention

The present invention can provide a cleaning apparatus capable of obtaining a cleaning liquid having a high degree of cleanliness.

MODE FOR CARRYING OUT THE INVENTION

Hereinafter, embodiments of the present invention are described in detail with reference to the drawings.

Figure 1:
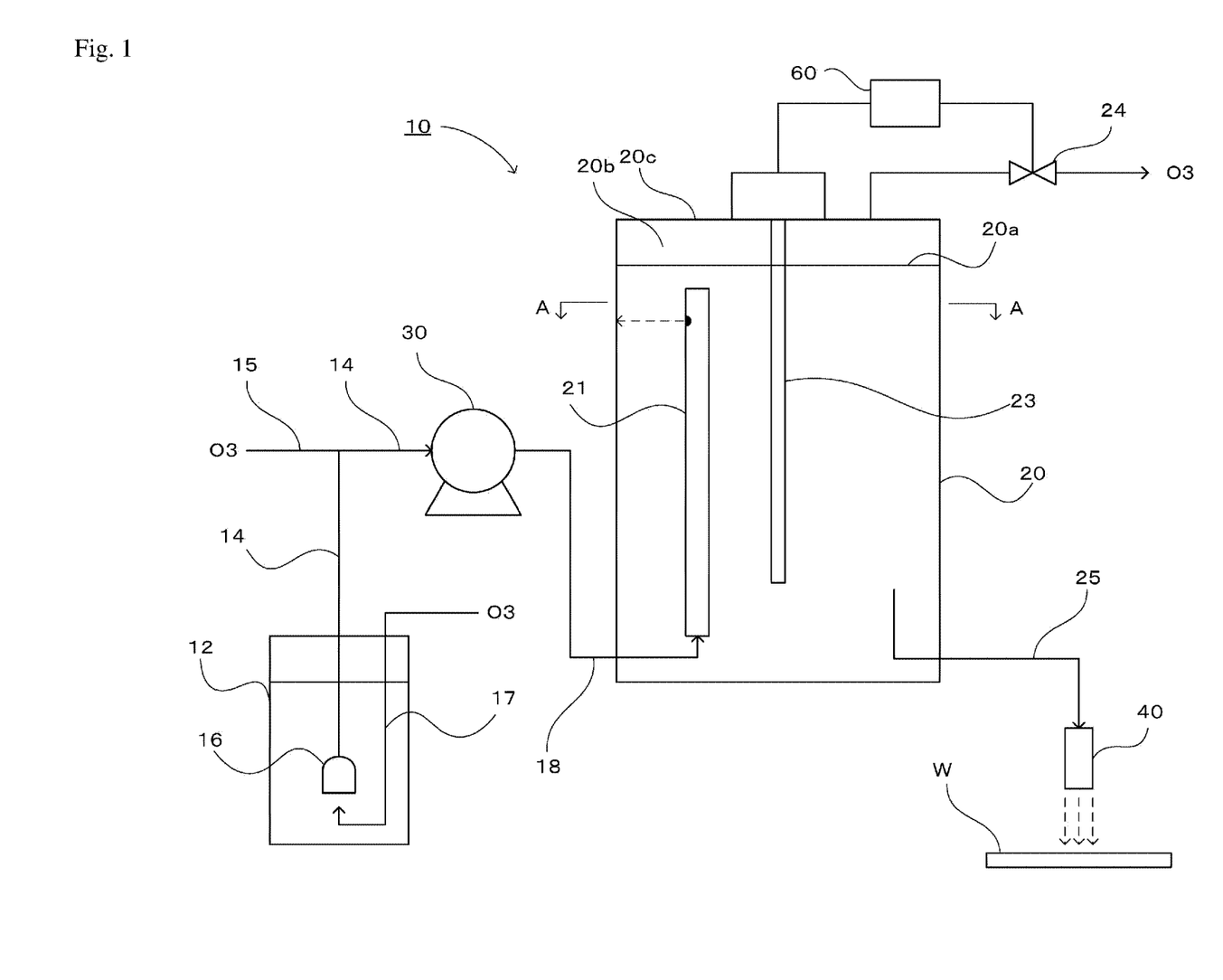
FIG. 1 is a flow diagram of a cleaning apparatus according to a first embodiment.
Figure 2:
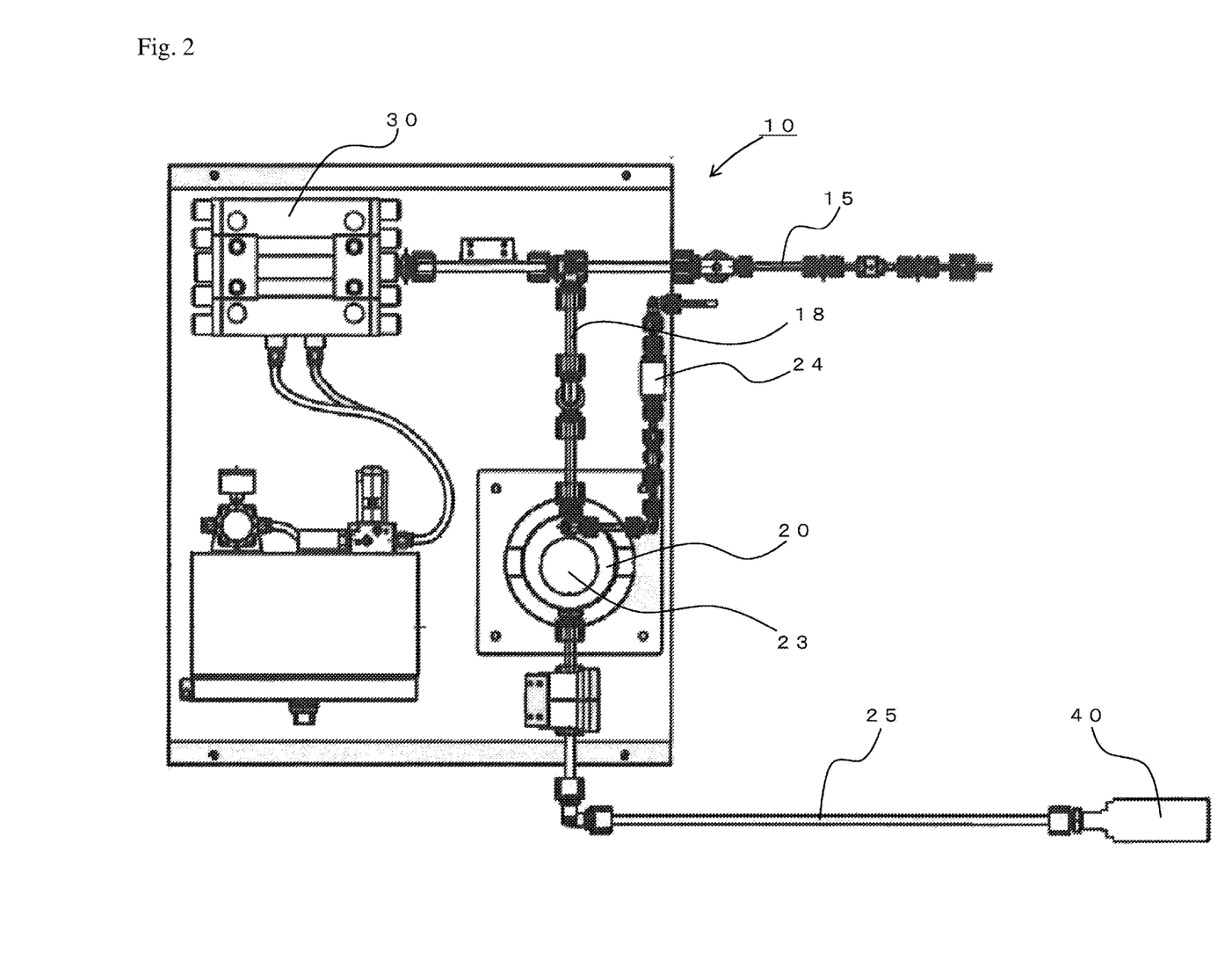
FIG. 2 is a plan view of the cleaning apparatus.
Figure 3:
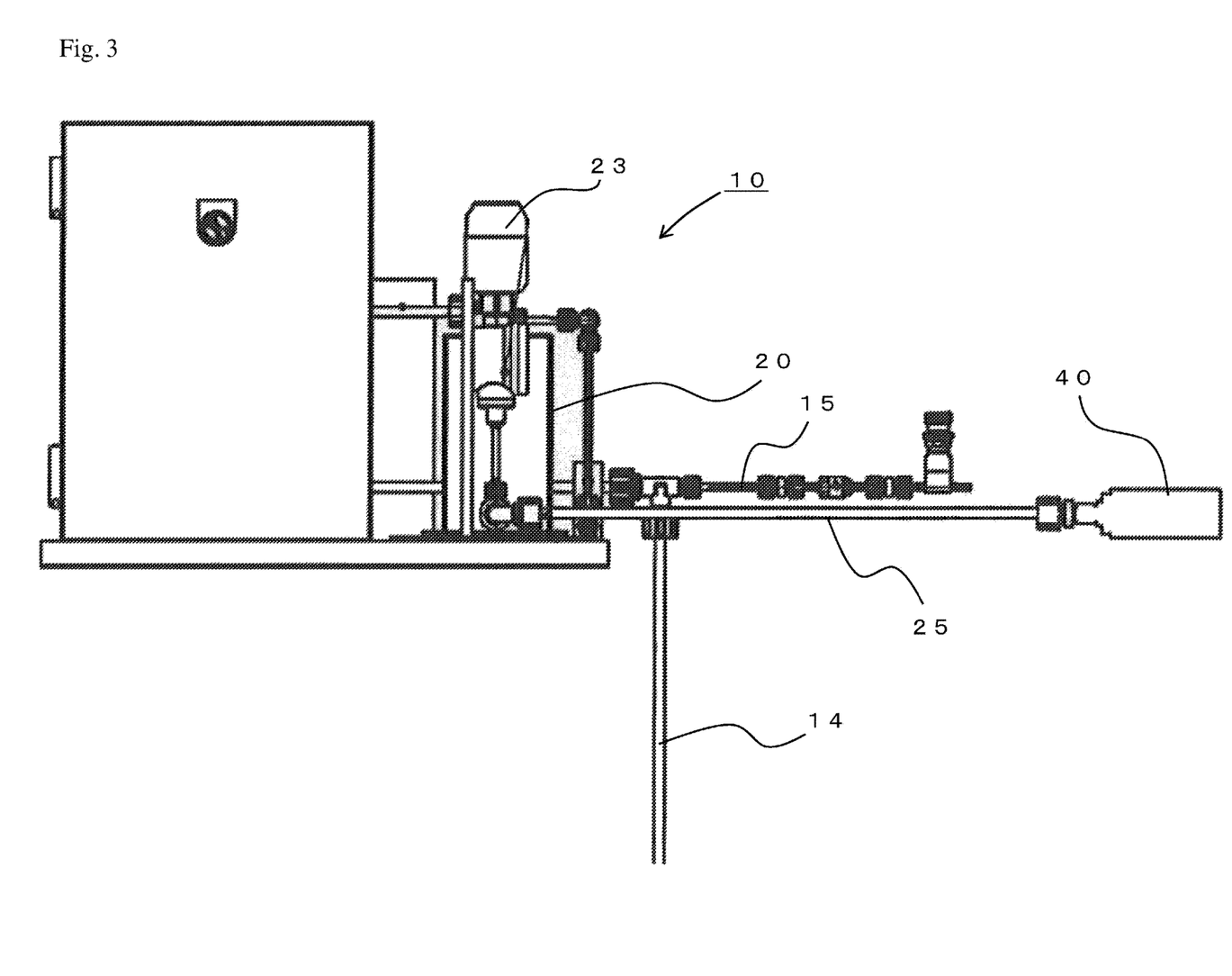
FIG. 3 is a front view of the cleaning apparatus.
Figure 4:
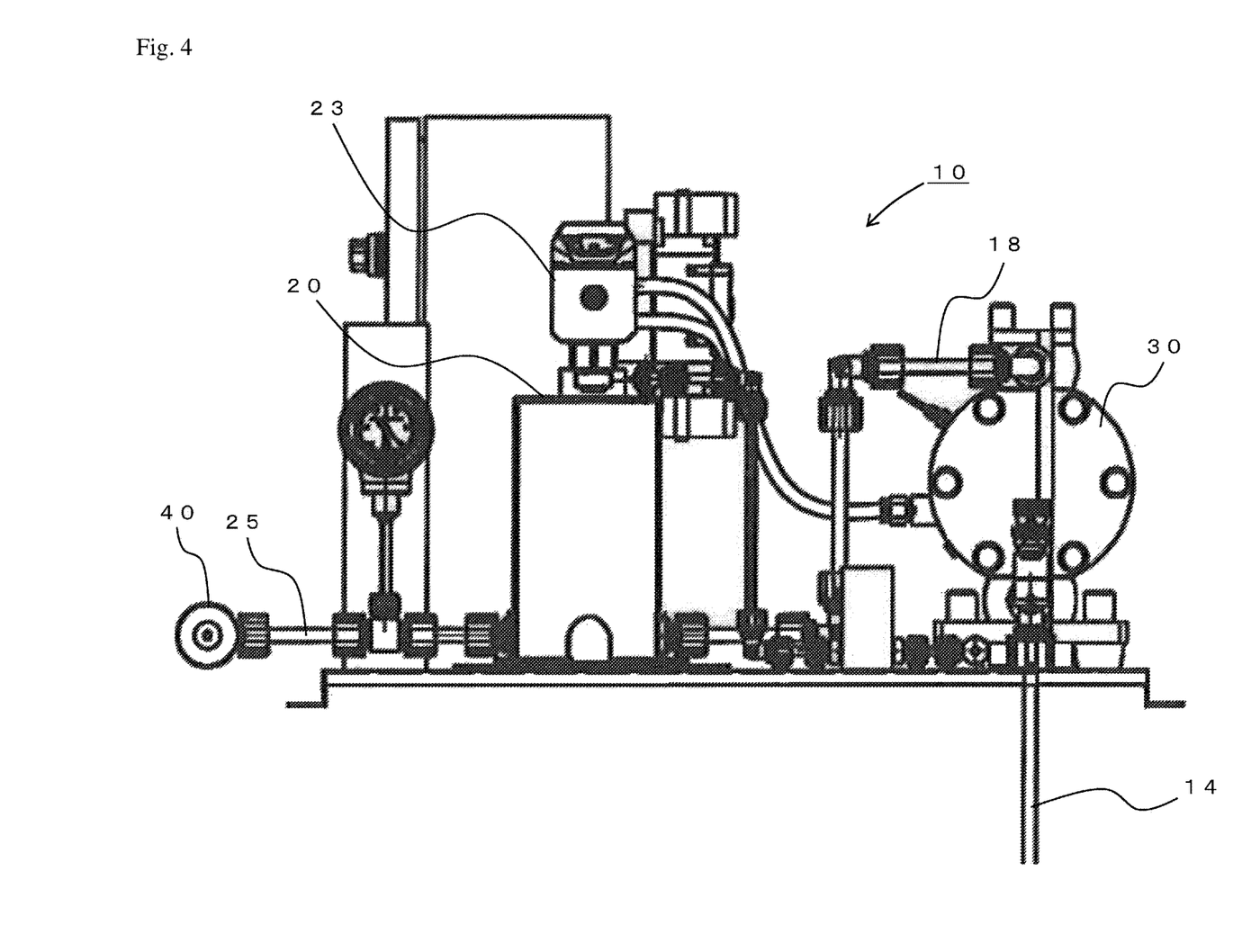
FIG. 4 is a side view of the cleaning apparatus.

FIG. 1 is a flow diagram of a cleaning apparatus according to a first embodiment. FIG. 2 is a plan view of the cleaning apparatus. FIG. 3 is a front view of the cleaning apparatus. FIG. 4 is a side view of the cleaning apparatus.

As shown in FIGS. 1 to 4, the cleaning apparatus 10 includes a dissolution tank 20 for dissolving ozone ($O_3$) in water, a transfer pump 30 for sending ozone ($O_3$) together with water to the dissolution tank 20, and a feed nozzle 40 for supplying the water stored in the dissolution tank 20 to a workpiece W. Those portions of the dissolution tank 20, the transfer pump 30 and the feed nozzle 40 which come in contact with water are made of a fluororesin.

The dissolution tank 20 is a cylindrical sealed tank which is formed of a steel material such as stainless steel, and is configured to be capable of holding a high pressure therein. All portions of the dissolution tank 20 which come in contact with water are made of a fluororesin. Specifically, the entire inner surface of the dissolution tank 20 is formed of a fluororesin, or is lined with a fluororesin. Polytetrafluoroethylene (PTFE), polychlorotrifluoroethylene (PCTFE), perfluoroalkoxy fluorocarbon resin (PFA), tetrafluoroethylene-hexafluoropropylene copolymer (FEP), ethylene tetrafluoroethylene copolymer (ETFE), ethylene-chlorotrifluoroethylene copolymer (ECTFE) and the like are available as the fluororesin. Among them, polytetrafluoroethylene (PTFE) is preferred.

The transfer pump 30 is a positive displacement pump, not a non-positive displacement pump such as a centrifugal pump. The positive displacement pump increases the pressure of a liquid in its space by changing the volume of the space. There are a reciprocating positive displacement pump and a rotating positive displacement pump, for example, a diaphragm pump, a gear pump, a piston pump, and a plunger pump. Although either type of positive displacement pump may be used as the transfer pump 30 in the present invention, it is preferable to use the diaphragm pump.

Portion of the transfer pump 30 which comes in contact with water is formed of a fluororesin. Specifically, at least an inner surface of a casing of the transfer pump 30 is lined with a fluororesin. Alternatively, the casing itself is formed of a fluororesin. An actuating member disposed inside the casing is also made of a fluororesin. When the transfer pump 30 is the diaphragm pump, for example, the diaphragm is formed of a fluororesin. When the transfer pump 30 is the gear pump, the gear is formed of a fluororesin. When the transfer pump 30 is the piston pump, the piston is formed of a fluororesin. When the transfer pump 30 is the plunger pump, the plunger is formed of a fluororesin. Although any one of the aforementioned fluororesins can be used as the fluororesin, it is preferable to use polytetrafluoroethylene (PTFE).

The feeding nozzle 40 serves to supply the workpiece W with cleaning water stored in the dissolution tank 20. In this embodiment, a microbubble generating nozzle is used as the feed nozzle 40. The use of the microbubble generating nozzle can cause bubbles with a particle size of, for example, 1 to 50 μm (microbubbles) to be generated in the cleaning water in which ozone is dissolved. The feed nozzle 40 may be, for example, an injection nozzle capable of injecting water stored in the dissolution tank 20 to a workpiece W. The details of the feed nozzle 40 will be given later.

Using the feed nozzle 40 makes it possible to generate microbubbles in the cleaning water in which ozone is dissolved. In this specification, microbubbles refer to, for example, bubbles with a particle size of 1 μm or larger and 50 μm or smaller. The number of microbubbles in the water may be measured by, for example, the liquid particle counter "LiQuilaz-E20" manufactured by Particle Measuring Systems Co. It is preferable to use a liquid particle counter of a light-shielding type in measuring the number of microbubbles in a liquid.

All bubbles generated by the feed nozzle 40 need not be microbubbles. Microbubbles may be, preferably, 30% or more of bubbles generated by the feed nozzle 40, more preferably, 50% or more of the bubbles, more preferably, 70% or more of the bubbles, and most preferably, 90% or more of the bubbles.

Next, the overall configuration of the cleaning apparatus 10 is described in detail.

As shown in FIGS. 1 to 4, the suction port of the transfer pump 30 is coupled via a pipe 14 to a pure water tank 12. The transfer pump 30 is capable of sucking pure water stored in the pure water tank 12, and feeding the pure water to the dissolution tank 20.

The suction port of the transfer pump 30 is also coupled to an ozone generator (not shown) via a pipe 15 branched from the pipe 14. The transfer pump 30 can suck the ozone generated by the ozone generator via the pipe 15. That is, the transfer pump 30 can suck the ozone together with pure water via the pipe 14 and the pipe 15. The sucked pure water and ozone are mixed inside the transfer pump 30, and then fed to the dissolution tank 20.

An end of the pipe 14 which is located on opposite to the other end connected to the transfer pump 30 is inserted into the pure water in the pure water tank 12. This end of the pipe 14 that is inserted into the pure water is attached with a cup 16 that is largely opened, on one side, in a trumpet shape. The ozone gas blown into the pure water can be collected by this cup 16. That is, the transfer pump 30 can not only suck the ozone gas through the pipe 15, but also suck the ozone gas blown into the pure water tank 12 through the pipe 17. The cup 16 is preferably formed of a fluororesin.

An injection pipe 21 for injecting the water fed by the transfer pump 30 toward the inner wall of the dissolution tank 20 is provided inside the dissolution tank 20. The injection pipe 21 is disposed almost vertically, and extends substantially over the entire area from the lower base of the dissolution tank 20 to the upper base thereof. The upper end of the injection pipe 21 is closed. Two injection holes 22a, 22b are provided at a portion which is slightly lower than the upper end of the injection pipe 21. The two injection holes 22a, 22b will be described later in detail. The injection pipe 21 is preferably formed of a fluororesin.

A discharge port of the transfer pump 30 is coupled to the lower end of the injection pipe 21 via a pipe 18. The pure water and ozone gas that are pressurized by the transfer pump 30 are supplied to the lower end of the pipe 21, and then injected toward the inner wall of the dissolution tank 20 through the two injection holes 22a, 22b formed in the upper portion of the injection pipe 21. Note that, in normal operation of the cleaning apparatus 10, the two injection holes 22a, 22b are positioned below a liquid level 20a of the dissolution tank 20.

A level gauge 23 capable of measuring the height of the liquid level 20a of the water stored in the dissolution tank is provided inside the dissolution tank 20. Although any type of level gauge may be used as the level gauge 23, a pulse guide type liquid level gauge is used in this embodiment. Preferably, that portion of the level gauge 23 which come in contact with water is either formed of a fluororesin, or lined with a fluororesin. Specifically, a contact (probe) of the level gauge 23 which comes in contact with water is preferably covered with a fluororesin.

Figure 5:
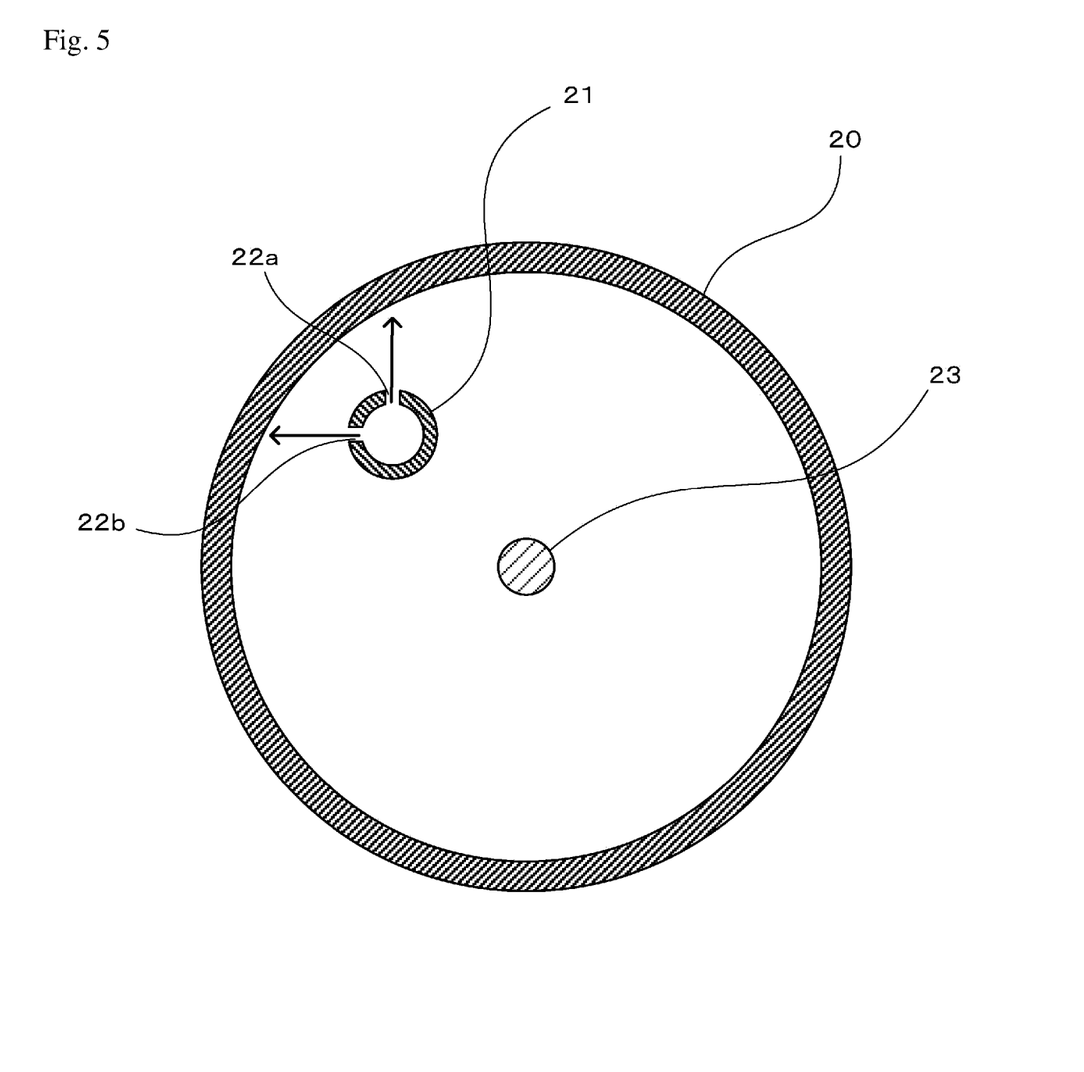
FIG. 5 is an A-A line cross-sectional view of the dissolution tank shown in FIG. 1.

FIG. 5 is a cross-sectional view of the dissolution tank 20 illustrated in FIG. 1 along line A-A.

As shown in FIG. 5, the level gauge 23 is provided at a center portion of the dissolution tank 20, and the injection pipe 21 is disposed at a position near the wall surface of the dissolution tank 20. The two injection holes 22a, 22b are provided in the outer periphery of the injection pipe 21 having substantially a circular cross section at positions separated by approximately 90 degrees in the circumferential direction. That is, the size of the central angle obtained by connecting the center of the injection pipe 21 to the two injection holes 22a, 22b is substantially 90 degrees. For example, the two injection holes 22a, 22b are provided at positions separated by 70 degrees to 110 degrees in the circumferential direction, preferably, 80 degrees to 100 degrees, and more preferably, 85 degrees to 95 degrees. The water and ozone gas are injected from the two injection holes 22a, 22b, in directions different from each other by about 90 degrees. The injection of the water and ozone gas in directions different from each other by about 90 degrees in this way produces, inside the dissolution tank 20, at least two swirling flows rotating in the reverse directions. This promotes the contact and stirring of the water and the ozone gas, so that more ozone gas can be dissolved in water. Although an example where the two injection holes 22a, 22b are provided in the injection pipe 21 is illustrated in FIG. 5, one injection hole or three or more injection holes may be provided in the injection pipe 21.

In addition, the water and ozone gas are injected from the injection pipe 21 in the direction opposite to the liquid level gauge 23. That is, in FIG. 5, the injection pipe 21 is separated into two areas by a line that is perpendicular to a line connecting the center point of the level gauge 23 to the center point of the injection pipe 21, and passes through the center point of the injection pipe 21. An injection hole is not provided in that one of the two regions which is closer to the level gauge 23, thereby preventing the water and ozone gas from hitting the level gauge 23 which otherwise may influence the measurements of the level gauge 23.

A gas release valve 24 for releasing the ozone gas accumulated above the liquid level 20a in the dissolution tank 20 to the outside is provided at the upper portion of the dissolution tank 20. It is preferable to use an air actuated valve as the gas release valve 24. When a solenoid valve is used, the metal portion of the solenoid valve may be corroded, so that a foreign matter may be mixed in the cleaning water in the dissolution tank 20. Pipes 14, 15, 17, 18, 25 for connecting a plurality of devices included in the cleaning apparatus 10 are not provided with valves. This is because, in light of the configuration of the cleaning apparatus 10, the use of air actuated valves in those pipes does not have a good technical significance, or the use of an electromagnetic valve may face the aforementioned probable mixture of a foreign matter.

As the gas release valve 24, a regulating valve capable of regulating the flow rate of the gas may be used, or an on-off valve that can change over the degree of opening only between 100% and 0% may be used.

As the gas release valve 24, for example, a ball valve, globe valve, a diaphragm valve or the like may be used; it is preferable to use the diaphragm valve among those valves. Further, as the gas release valve 24, it is preferable to use a valve whose pipe part is formed of a fluororesin.

As shown in FIG. 1, the cleaning apparatus 10 includes a control means 60. The control means 60 is electrically coupled to the gas release valve 24 and the liquid level gauge 23. The control means 60 can control the gas release valve 24 so that the height of the liquid level 20a which is measured by the level gauge 23 becomes constant. Specifically, the control unit 60 compares the height of the liquid level 20a measured by the level gauge 23 with a preset target value, and controls the gas release valve 24 on the basis of the comparison result. A known control device capable of controlling an actuator, such as a valve, may be used as the control unit 60; for example, a sequencer may be used.

For example, when the height of the liquid level 20a measured by the level gauge 23 is much higher than the target value (HH), the gas release valve 24 is fully closed (the degree of opening being 0%). When the liquid level 20a measured by the level gauge 23 is higher than the target value (H), the gas release valve 24 is closed to some extent (the degree of opening being 30%). When the height of the liquid level 20a measured by the level gauge 23 is lower than the target value (L), the gas release valve 24 is opened to some extent (the degree of opening being 70%). When the height of the liquid level 20a measured by the level gauge 23 is significantly lower than the target value (LL), the gas release valve 24 is fully opened (the degree of opening being 100%).

Although an example of a method of controlling the gas release valve 24 has been illustrated, the gas release valve 24 may be controlled by other methods.

As shown in FIG. 1, the dissolution tank 20 is coupled to the feed nozzle 40 via the pipe 25. Since the pressure inside the dissolution tank 20 is set high (for example, 0.4 MPa) by the transfer pump 30, the cleaning water is swiftly discharged from the feed nozzle 40. The pressure inside the dissolution tank 20 may be adjusted by the discharge pressure of the transfer pump 30. Alternatively, the pressure inside the dissolution tank 20 may also be adjusted by opening or closing the gas release valve 24.

The pipes 14,15,17,18,25 for connecting a plurality of devices included in the cleaning apparatus 10 are formed of a fluororesin. Although any one of the aforementioned fluororesins can be used as the fluororesin, it is preferable to use polytetrafluoroethylene (PTFE).

Figure 6:
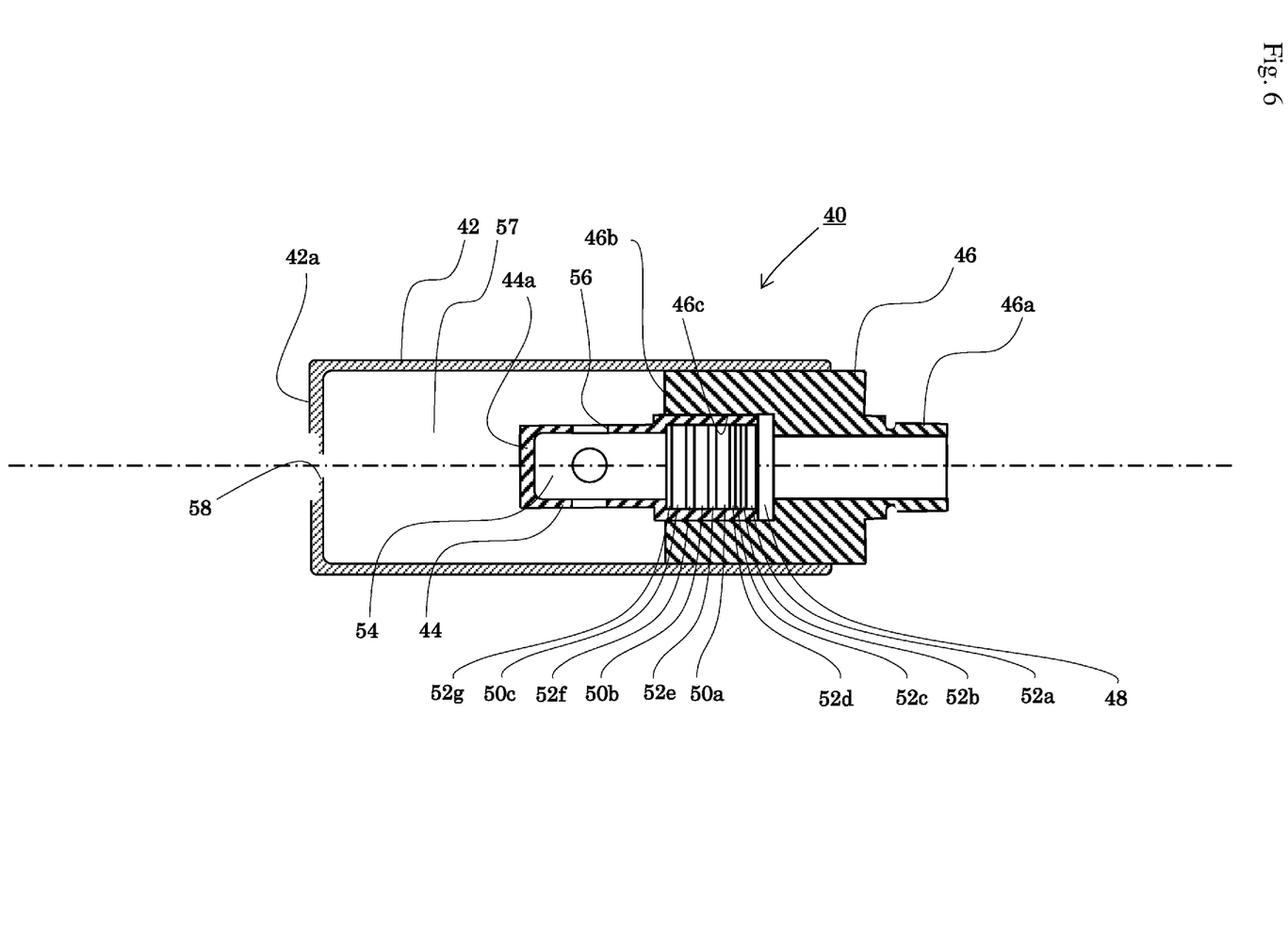
FIG. 6 is a cross-sectional view of a feed nozzle.

FIG. 6 is a cross-sectional view of the feed nozzle 40.

As shown in FIG. 6, the feed nozzle 40 includes a cylindrical outer member 42 having one end closed by a wall portion 42a and an other end open, and a cylindrical inner member 44 having one end closed by a wall portion 44a and an other end open. The inner diameter of the outer member 42 is larger than the outer diameter of the inner member 44. The inner member 44 is disposed inside the outer member 42 in such a way that their axial centers are aligned with each other.

The feed nozzle 40 includes a connector 46 formed in substantially a cylindrical shape. One end 46a of the connector 46 is connected to the pipe 25 having one end connected to the dissolution tank 20. A cylindrical recess 46c is formed at an other end 46b of the connector 46. That end of the inner member 44 which is open is fitted in this recess 46c. That end of the outer member 42 which is open is fitted in the outer periphery of the end 46b of the connector 46. The outer member 42, the inner member 44 and the connector 46 are assembled integrally with one another by screw-in or the like.

An orifice 48, three perforated plates 50a to 50c, and seven spacers 52a to 52g are disposed inside the inner member 44. These members are disposed in the order of the orifice 48, the spacer 52a, the spacer 52b, the spacer 52c, the spacer 52d, the perforated plate 50a, the spacer 52e, the perforated plate 50b, the spacer 52f, the perforated plates 50c, and the spacer 52g from the upstream side.

Although an example where three perforated plates 50a to 50c are disposed is illustrated, the number of perforated plates is not limited to three. For example, the number of perforated plates may be adjusted within the range of one to six in accordance with the water quality. Bubbles suitable for an intended work may be generated by adjusting the number of perforated plates.

The orifice 48 is a circular plate having a predetermined thickness, holes are provided in the center.

The spacer 52a, 52e, 52f is a circular plate having a predetermined thickness (e.g. 2.0 mm).

The spacer 52b, 52c, 52d, 52g is a circular plate having a predetermined thickness (e.g. 1.0 mm).

The perforated plate 50a, 50c is a circular plate having a plurality of small holes (for example, 1.0 mmϕ) formed therein.

The perforated plate 50b is a circular plate having a plurality of small holes (for example, 0.5 mmϕ) formed therein.

The spacer is preferably placed between the perforated plates. It is preferable to provide a space of at least 0.5 mm between the perforated plates. A space of 3 mm to 5 mm may be provided between the perforated plate plates. The provision of a space between the perforated plates makes it possible to generate bubbles efficiently.

Those parts constituting the feed nozzle 40 are preferably formed of a fluororesin. That is, the outer member 42, the inner member 44, the connector 46, the three perforated plates 50a to 50c, and the seven spacers 52a to 52g are preferably formed of a fluororesin. Although any one of the aforementioned fluororesins can be used as the fluororesin, it is preferable to use polytetrafluoroethylene (PTFE).

A first pressure relief chamber 54 is formed between the spacer 52g and the wall portion 44a of the inner member 44, and a plurality of through holes 56 are formed in the peripheral wall of the first pressure relief chamber 54. A second pressure relief chamber 57 is formed between the inner wall surface of the outer member 42 and the outer wall surface of the inner member 44. A substantially circular nozzle hole 58 for supplying water containing microbubbles is opened in the wall portion 42a of the outer member 42.

The following describes the mechanism of generating microbubbles by means of the feed nozzle 40.

The water that is supplied from the dissolution tank 20 via the pipe 25 passes through the interior of the connector 46, and then passes through the orifice 48. Part of the ozone dissolved in the water becomes air bubbles due to the differential pressure between the upstream and downstream of the orifice 48, thereby generating the bubbles.

The water passes through the orifice 48, and then passes through the perforated plate 50a, perforated plate 50b, and a perforated plate 50c. A plurality of small holes are opened in these perforated plates. The sizes of the small holes are 1.0 mmϕ, 0.5 mmϕ, and 1.0 mmϕ, respectively, from the upstream side. That is, the sizes of the small holes of the adjacent perforated plates are different from each other.

As water passes through the three perforated plate 50a to 50c, an extremely complex turbulent flow is generated in the water. Because this turbulence shears the bubbles finely, the particle size of the bubbles is reduced.

After passing through the three perforated plates 50a to 50c, the water then flows into the first pressure relief chamber 54. The water that has flowed into the first pressure relief chamber 54 then passes through the through hole 56 formed in a side wall of the first pressure relief chamber 54. At this time, the traveling direction of the water changes 90 degrees, so that the bubbles are further sheared by the turbulence.

The water passes through the through hole 56, and hits the inner wall surface of the outer member 42. As the water hits the inner wall surface of the outer member 42, the particle size of the bubbles becomes smaller.

After hitting the inner wall surface of the outer member 42, the water flows into the second pressure relief chamber 57. At this time, the traveling direction of the water changes 90 degrees, the bubbles are further sheared by the turbulence.

The water that has flowed into the second pressure relief chamber 57 is supplied from the nozzle hole 58 toward a workpiece W. The water supplied from the nozzle hole 58 includes bubbles (microbubble) whose particle size is reduced to 1 to 50 μm by the mechanism described above.

The action and effects of the cleaning apparatus 10 are described next.

The conventional ozone water production apparatus uses metals for those portions of a tank, a pipe, a valve and a pump or the like which come into contact with a liquid. Accordingly, sometimes metal ions are eluted into pure water, or a foreign matter produced by corrosion of the metals is mixed into wash water.

According to the cleaning apparatus 10 of the present embodiment, those portions of the dissolution tank 20, the transfer pump 30, and the feed nozzle 40 which come in contact with water are formed of a fluororesin. This prevents the elution of metal ions and mixing of a foreign matter, thus ensuring that cleaning water with a higher degree of cleanliness can be obtained.

In addition, those portions of the pipes 14, 15, 17, 18, and 25, the cup 16, the injection pipe 21, and the level gauge 23 which come in contact with water are also formed of a fluororesin. This prevents the contamination of cleaning water with a metal more effectively.

Further, when the transfer pump 30 is a diaphragm pump, the diaphragm is formed of a fluororesin. This further prevents the contamination of cleaning water with a metal effectively.

The transfer pump 30 feeds the pure water pumped up from the pure water tank 12 to the dissolution tank 20. The internal pressure of the dissolution tank 20 is kept high. Specifically, the pressure in the space 20b above the liquid level 20a of the dissolution tank 20 is kept at 0.2 to 0.6 MPa, preferably, at 0.3 to 0.5 MPa, and, more preferably, at 0.4 MPa. Accordingly, a larger amount of ozone gas may be dissolved in water in the dissolution tank 20. Further, a larger amount of microbubbles may be generated by the feed nozzle 40.

In order to increase the concentration of ozone in the cleaning water, an excess amount of ozone gas needs to be fed into the dissolution tank 20 by the transfer pump 30. Therefore, the ozone gas released from the water is accumulated in the space 20b above the liquid level 20a of the dissolution tank 20.

When transfer pump 30 is a diaphragm pump, for example, the pressure of the water that is transported by the diaphragm pump fluctuates (pulsates). In this case, the amount of the cleaning water supplied from the feed nozzle 40 is not constant, uneven cleaning undesirably occurs when the cleaning water is used to clean semiconductor wafers or the like. Therefore, it has not been thought possible to use a positive displacement pump (diaphragm pump) as a pump in the conventional ozone water production apparatus for feeding water and ozone into the tank.

The cleaning apparatus 10 according to the present embodiment secures the space 20b above the liquid level 20a of the dissolution tank 20, so that the space 20b can absorb the pressure fluctuation caused by the transfer pump 30. Therefore, even in the case of using a positive displacement pump as a pump for feeding water and ozone, the amount of cleaning water supplied from the feed nozzle 40 is kept constant.

The height of the liquid level 20a of the dissolution tank 20 is kept at 1 mm or more and 100 mm or less, preferably, at 1 mm or more and 70 mm or less, more preferably, at 1 mm or more and 50 mm or less, more preferably, at 1 mm or more and 30 mm or less, and, most preferably, at 1 mm or more and 20 mm or less, from the upper base 20c of the dissolution tank 20. When the height of the liquid level 20a is above the position which is 1 mm from the upper base 20c, the volume of the space 20b is too small to sufficiently absorb the pressure fluctuation caused by the transfer pump 30. When the height of the liquid level 20a is below the position which is 100 mm from the upper base 20c, the volume of the space 20b is too large so that it is difficult to control the flow rate of the cleaning water supplied from the feed nozzle 40 at a constant rate.

Accordingly, it is preferable that the control means 60 should control the gas release valve 24 in such a way that the height of the liquid level 20a which is measured by the level gauge 23 becomes 1 mm or more and 100 mm or less, preferably, 1 mm or more and 70 mm or less, more preferably, 1 mm or more and 50 mm or less, more preferably, 1 mm or more and 30 mm or less, and, most preferably, 1 mm or more and 20 mm or less, from the upper base 20c of the dissolution tank 20. How to control the gas release valve 24 to make the height of the liquid level 20a constant is as described above.

The cleaning apparatus 10 according to the present embodiment can supply cleaning water with an extremely high degree of cleanliness to a workpiece W. Microbubbles which are included in the cleaning water will remain for a long period of time in the cleaning water. The cleaning effect of ozone and microbubbles is enormous to enable an extremely high degree of cleaning of the workpiece W.

Figure 7:
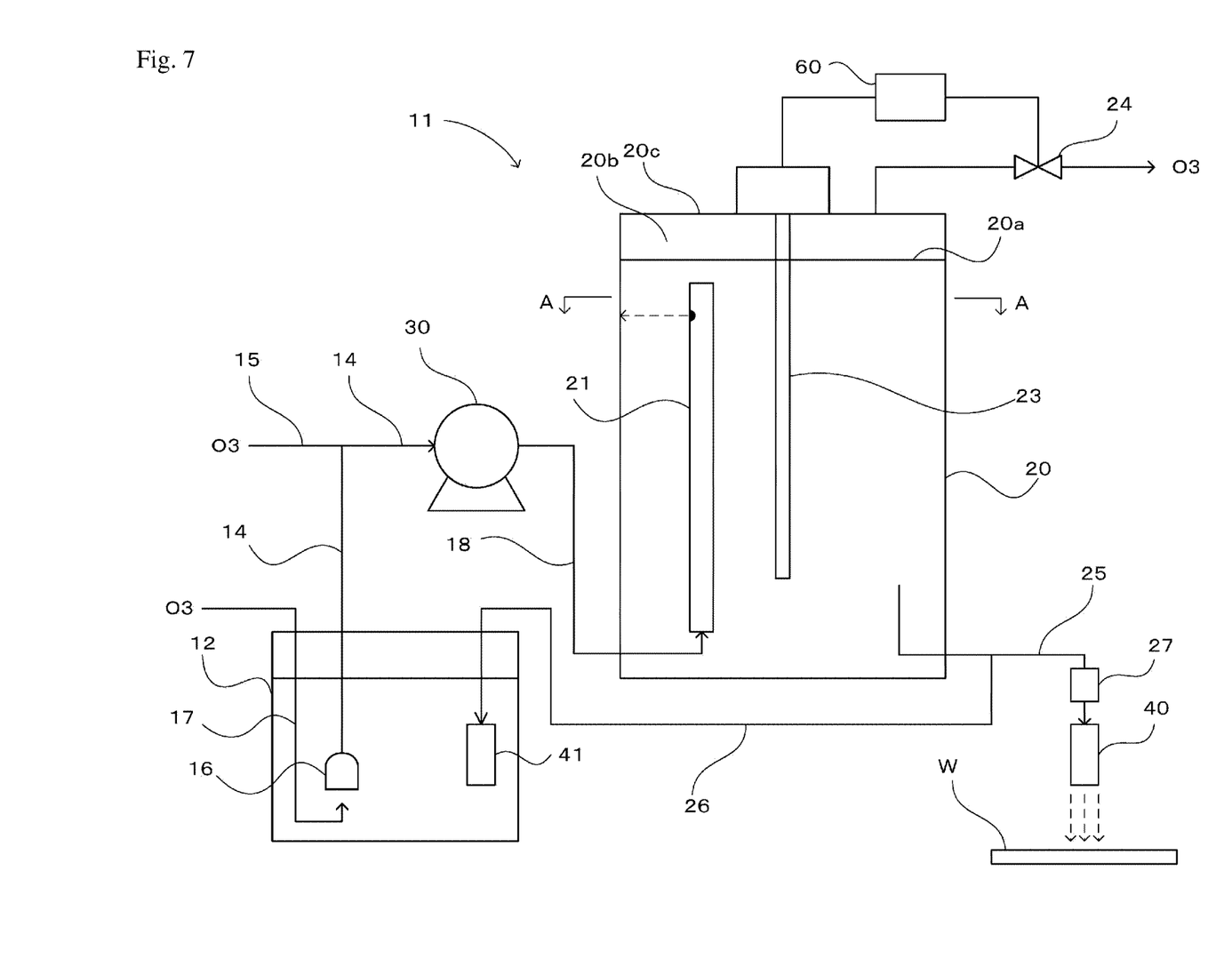
FIG. 7 is a flow diagram of a cleaning apparatus according to a second embodiment.

FIG. 7 is a flow diagram of a cleaning apparatus according to a second embodiment of the present invention. In FIG. 7, the same reference numerals are given to the same elements as those of the first embodiment.

The cleaning apparatus 11 illustrated in FIG. 7 includes a return pipe 26 for returning cleaning water stored in the dissolution tank 20 to the pure water tank 12. An end of the return pipe 26 is inserted into the pure water stored in the pure water tank 12. A feed nozzle 41 for generating the microbubbles is attached to that end of the return pipe 26 which is inserted into the pure water. The return pipe 26 and the feed nozzle 41 are formed of a fluororesin.

According to the cleaning apparatus 11 illustrated in FIG. 7, the cleaning water stored in the dissolution tank 20 can be returned to the pure water tank 12 via the return pipe 26. This makes it possible to circulate the cleaning water between the dissolution tank 20 and the pure water tank 12 until the concentration of a gas in the cleaning water or the density of the microbubbles in the cleaning water reaches a predetermined value.

As illustrated in FIG. 7, a temperature control device 27 for controlling the temperature of the cleaning water may be provided in a midway of the pipe 25. The temperature control device 27 can control the temperature of the cleaning water that is fed to the feed nozzle 40 at a given temperature. For example, it is possible to heat (or cool) the cleaning water which is fed to the feed nozzle 40 to a temperature effective to clean the workpiece W.

The cleaning apparatus 10 cleans a workpiece W with microbubbles ozone water. Examples of the workpiece W include a semiconductor wafer, a liquid crystal substrate, a solar cell substrate, a glass substrate, and a mask blank, which require a high degree of cleanliness, but are not limited thereto.

The cleaning apparatus 10 according to the present invention may be applied to, for example, a medical field (visceral washing or the like) in addition to cleaning of semiconductor wafers.

Although the gas to be dissolved in water is illustrated to be ozone in the above example, the present invention may also be applied when other gases are dissolved in water. For example, the present invention may also be applied when the gas to be dissolved in water is oxygen ($O_2$), hydrogen peroxide ($H_2O_2$), nitrogen ($N_2$), hydrogen ($H_2$) or the like. Further, the present invention may also be applied when a plurality of types of gases are dissolved in water. For example, the present invention may also be applied when carbon dioxide and ozone even are dissolved in water. When carbon dioxide and ozone are dissolved in water, the time of dissolution of ozone in ozone water can be extended.

Although the liquid in which a gas is dissolved is illustrated to be water in the above example, the present invention may also be applied to other liquids. For example, the present invention may also be applied in case of liquids such as an organic solvent, aqueous sulfuric acid, aqueous ammonia, and a slurry.

Although a single feed nozzle 40 is provided in the cleaning apparatus 10 in the above example, two or more feed nozzles 40 may be provided.

Although a single cleaning apparatus 10 alone is provided in the above example, a plurality of cleaning apparatuses 10 may be provided in parallel.

Figure 8:
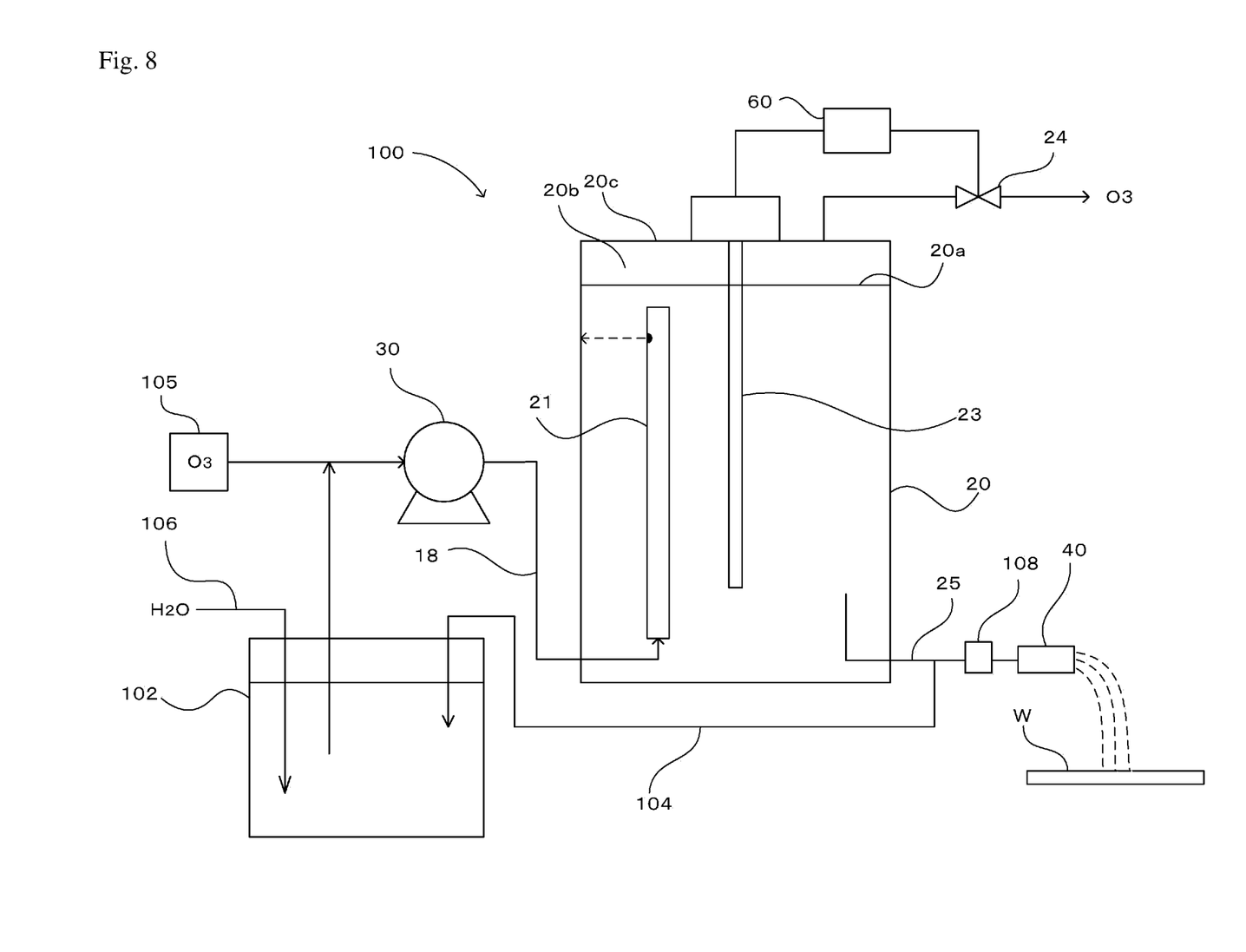
FIG. 8 is a flow diagram of a cleaning apparatus according to a third embodiment.

FIG. 8 is a flow diagram of a cleaning apparatus according to a third embodiment of the present invention. In FIG. 8, the same reference numerals are given to the same elements as those of the first embodiment or the second embodiment.

The cleaning apparatus 100 illustrated in FIG. 8 includes a return pipe 104 for returning ozone water (cleaning water) stored in the dissolution tank 20 to a circulation tank 102. The ozone water stored in the dissolution tank 20 can be circulated between the dissolution tank 20 and the circulation tank 102 through the return pipe 104. The circulation of the ozone water between the dissolution tank 20 and the circulation tank 102 can increase the concentration of the ozone water in the dissolution tank 20. Note that a pure-water supply pipe 106 for supplying pure water into the circulation tank 102 is connected to the circulation tank 102.

The cleaning apparatus 100 illustrated in FIG. 8 includes an ozone producing apparatus 105. The ozone water stored in the circulation tank 102 is fed into a lower portion of the dissolution tank 20 by the transfer pump 30. The ozone ($O_3$) that is produced by the ozone producing apparatus 105 is fed together with the ozone water stored in the circulation tank 102 to the lower portion of the dissolution tank 20 by the transfer pump 30. Accordingly, the concentration of the ozone water in the dissolution tank 20 can be increased further.

The cleaning apparatus 100 illustrated in FIG. 8 includes a heater 108 for heating the ozone water. The heater 108 is provided at a position immediately before the feed nozzle 40. That is, the heater 108 can heat the ozone water produced in the dissolution tank 20 just before the ozone water is supplied to the workpiece W. This makes it possible to suppress a reduction in the concentration of ozone water produced in dissolution tank 20, which otherwise is caused by heating by the heater 108, before the ozone water is supplied to the workpiece W.

Heating the ozone water with the heater 108 can further enhance the cleaning effect of the ozone water. The temperature of heating the ozone water with the heater 108 is, for example, 30° C. or higher and 80° C. or lower, preferably, 40° C. or higher and 70° C. or lower, and, more preferably, 50° C. or higher and 60° C. or lower. Any type of heater may be used as the heater 108 for heating ozone water. For example, the "Super Clean Heater" manufactured by Techno Vision Ltd. may be used as the heater 108 for heating ozone water.

The cleaning apparatus 100 illustrated in FIG. 8 includes the feed nozzle 40 for supplying cleaning water (ozone water) to a workpiece W. In the third embodiment, the feed nozzle 40 is disposed in such a way that the direction of ejection of the ozone water is a transverse direction (horizontal direction). The transverse arrangement of the feed nozzle 40 can prevent the ozone water remaining in the feed nozzle 40 from falling over the workpiece W when the supply of the ozone water is stopped. This makes it possible to precisely control the duration of supplying the ozone water to the workpiece W. From the viewpoint of preventing the ozone water remaining in the feed nozzle 40 from falling over the workpiece W, the direction of the ozone water ejected from the feed nozzle 40 may be upward (vertical direction), or at an any angle between the transverse direction (horizontal direction) and the upward direction (vertical direction). This may be achieved by aligning the orientation of the feed nozzle 40 with the direction of ejection of the ozone water. A pipe for vacuum suction of the ozone water remaining inside the feed nozzle 40 may be provided on a side of the feed nozzle 40. The suction of the ozone water remaining inside the feed nozzle 40 makes it possible to control the duration of supplying the ozone water to the workpiece W more precisely.

Figure 9:
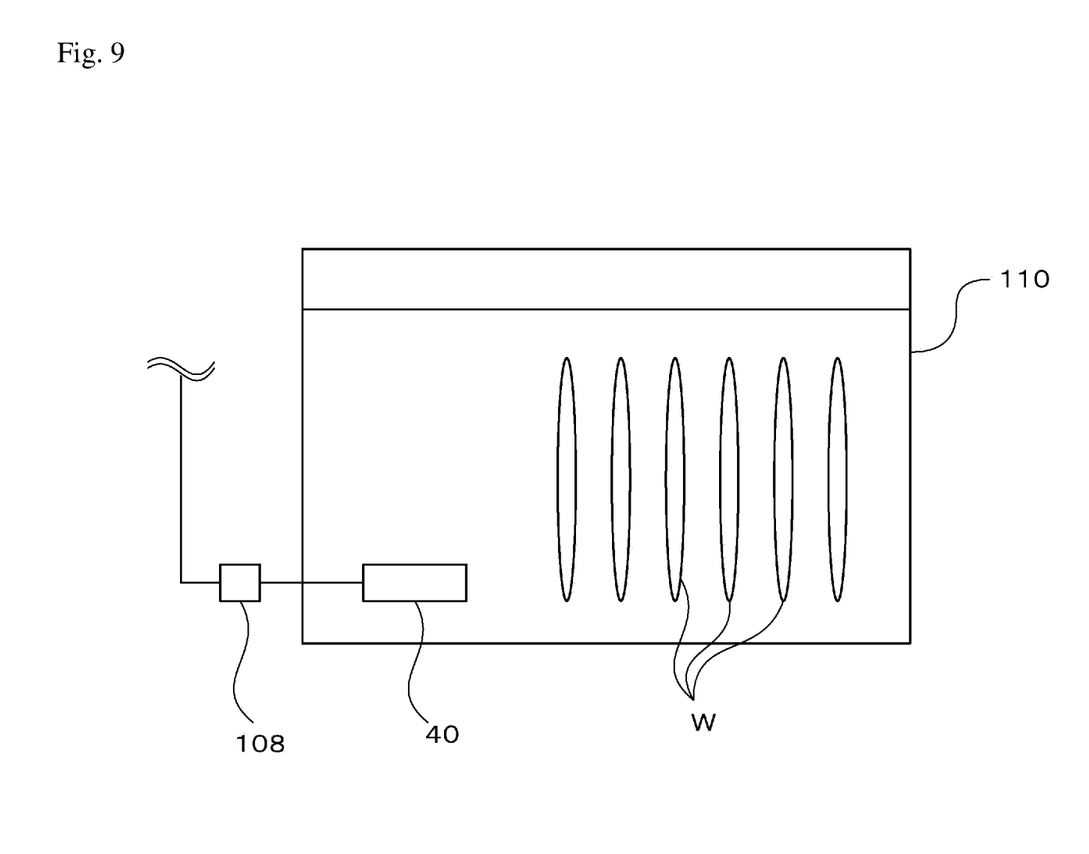
FIG. 9 is a side view illustrating a dipping type cleaning apparatus.

The cleaning apparatus according to the present invention may be used to clean semiconductor substrates. For example, the cleaning apparatus according to the present invention may be applied to a single wafer cleaning apparatus for cleaning semiconductor substrates one by one. As illustrated in FIG. 9, the cleaning apparatus according to the present invention may also be applied to a cleaning apparatus of a type which immerses a plurality of semiconductor substrates into the cleaning tank 110 at once (dipping type cleaning apparatus).

DESCRIPTION OF REFERENCE NUMERALS 10, 11 Cleaning apparatus
12 Pure water tank
14,15,17,18,25 Pipe
20a Liquid level
20b Space
20c Upper base
20 Dissolution tank
21 Injection pipe
22a, 22b Injection hole
23 Level gauge
24 Gas release valve
26 Return pipe
30 Transfer pump
40, 41 Feed nozzle
60 Control means
W Workpiece
100 Cleaning apparatus
102 Circulation tank
104 Return pipe
105 Ozone producing apparatus
106 Pure-water supply pipe
108 Heater
110 Cleaning tank

The invention claimed is:

1. A cleaning apparatus comprising:
   a dissolution tank for dissolving a gas in a liquid;
   a transfer pump for sending the liquid together with the gas into the dissolution tank; and
   a feed nozzle for feeding the liquid from the dissolution tank to a workpiece,
   wherein
   the transfer pump is a positive displacement pump,
   portions of the dissolution tank, the transfer pump, and the feed nozzle that come into contact with the liquid are made of a fluororesin,
   the feed nozzle is a microbubble generating nozzle,
   an injection pipe is provided inside the dissolution tank,
   an injection hole for injecting the liquid sent by the positive displacement pump toward an inner wall of the dissolution tank is provided in an outer periphery of the injection pipe, and
   the injection hole is positioned below a liquid level of the dissolution tank.

2. The cleaning apparatus according to claim 1, wherein the gas is ozone.

3. The cleaning apparatus according to claim 1, wherein the liquid is water.

4. The cleaning apparatus according to claim 1, wherein the transfer pump is a diaphragm pump, and a diaphragm of the diaphragm pump is made of a fluororesin.

5. The cleaning apparatus according to claim 1, further comprising a second injection hole provided in the outer periphery of the injection pipe such that
- at least two injection holes are provided in the outer periphery of the injection pipe, and
- the two injection holes are provided in positions separated by approximately 90 degrees from each other in the outer periphery of the injection pipe.

6. The cleaning apparatus according to claim 1, wherein a gas release valve for releasing a portion of the gas that accumulates inside the dissolution tank to outside is provided at an upper portion of the dissolution tank.

7. The cleaning apparatus according to claim 6, comprising:
- a level gauge for measuring a height of a level of the liquid stored in the dissolution tank; and
- a controller configured to control the gas release valve so that the height of the liquid level measured by the level gauge becomes constant.

8. The cleaning apparatus according to claim 7, wherein the controller controls the gas release valve so that the height of the liquid level measured by the level gauge becomes 1 mm or more and 20 mm or less from an upper base of the dissolution tank.

9. The cleaning apparatus according to claim 1, wherein the workpiece is a semiconductor wafer, a liquid crystal substrate, or a solar cell substrate.

10. The cleaning apparatus according to claim 1, comprising:
- a gas release valve for releasing a portion of the gas that accumulates inside the dissolution tank to outside, the gas release valve being provided at an upper portion of the dissolution tank,
- a level gauge for measuring a height of a level of the liquid stored in the dissolution tank; and
- a controller configured to control the gas release valve so that the height of the liquid level measured by the level gauge becomes constant.

* * * * *